(12) United States Patent
Doyle et al.

(10) Patent No.: US 10,115,661 B2
(45) Date of Patent: Oct. 30, 2018

(54) SUBSTRATE-LESS DISCRETE COUPLED INDUCTOR STRUCTURE

(71) Applicant: QUALCOMM Incorporated, San Diego, CA (US)

(72) Inventors: James Thomas Doyle, San Diego, CA (US); Farsheed Mahmoudi, San Diego, CA (US); Amirali Shayan Arani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/791,388

(22) Filed: Mar. 8, 2013

(65) Prior Publication Data

US 2014/0225700 A1  Aug. 14, 2014

Related U.S. Application Data

(60) Provisional application No. 61/762,555, filed on Feb. 8, 2013.

(51) Int. Cl.
*H01F 5/00* (2006.01)
*H01F 27/28* (2006.01)
(Continued)

(52) U.S. Cl.
CPC ... *H01L 23/49822* (2013.01); *H01F 17/0006* (2013.01); *H01L 23/645* (2013.01);
(Continued)

(58) Field of Classification Search
USPC .................................. 336/200, 232; 29/602.1
See application file for complete search history.

(56) References Cited

U.S. PATENT DOCUMENTS 4,604,160 A * 8/1986 Murakami et al. ............. 216/18
7,432,794 B2   10/2008 Mattsson
(Continued)

FOREIGN PATENT DOCUMENTS

CN     1716467 A    1/2006
CN   102906833 A    1/2013
(Continued)

OTHER PUBLICATIONS

International Search Report and Written Opinion—PCT/US2014/014270—ISA/EPO—dated Apr. 17, 2014.
(Continued)

*Primary Examiner* — Tsz Chan
(74) *Attorney, Agent, or Firm* — Loza & Loza, LLP/Qualcomm

(57) ABSTRACT

Some novel features pertain to an inductor structure that includes a first inductor winding, a second inductor winding and a filler. The first inductor winding includes an electrically conductive material. The second inductor winding includes an electrically conductive material. The filler is laterally located between the first inductor winding and the second inductor winding. The filler is configured to provide structural coupling of the first and second inductor windings. In some implementations, the first inductor winding is laterally co-planar to the second inductor winding. In some implementations, the first inductor winding has a first spiral shape and the second inductor winding has a second spiral shape. In some implementations, the first inductor winding and the second inductor winding have an elongated circular shape. In some implementations, the filler is an epoxy.

36 Claims, 14 Drawing Sheets

(51) Int. Cl.
*H01L 23/498* (2006.01)
*H01F 17/00* (2006.01)
*H01L 23/64* (2006.01)
*H01L 49/02* (2006.01)
*H01L 25/10* (2006.01)

(52) U.S. Cl.
CPC ............ *H01L 25/105* (2013.01); *H01L 28/10* (2013.01); *H01L 2224/16225* (2013.01); *H01L 2224/32145* (2013.01); *H01L 2224/32225* (2013.01); *H01L 2224/73204* (2013.01); *H01L 2225/06562* (2013.01); *H01L 2225/1023* (2013.01); *H01L 2225/1058* (2013.01); *H01L 2924/15313* (2013.01); *H01L 2924/15331* (2013.01); *H01L 2924/19106* (2013.01); *Y10T 29/4902* (2015.01)

(56) References Cited

U.S. PATENT DOCUMENTS

| | | |
|---|---|---|
| 7,956,603 B2 | 6/2011 | Cochran |
| 8,203,417 B2 | 6/2012 | Cordier et al. |
| 8,212,155 B1 | 7/2012 | Wright et al. |
| 2001/0024739 A1 | 9/2001 | Mizoguchi et al. |
| 2006/0001520 A1 | 1/2006 | Kaji et al. |
| 2006/0244117 A1 | 11/2006 | Karnezos et al. |
| 2007/0001794 A1 | 1/2007 | Alford et al. |
| 2008/0001698 A1 | 1/2008 | Hazucha et al. |
| 2009/0017042 A1 | 1/2009 | Camargo et al. |
| 2009/0079529 A1* | 3/2009 | Knott et al. ............ 336/90 |
| 2009/0170242 A1 | 7/2009 | Lin et al. |
| 2010/0026368 A1* | 2/2010 | Tang et al. ............ 327/361 |
| 2011/0049687 A1* | 3/2011 | Kuan et al. ............ 257/667 |
| 2011/0084386 A1* | 4/2011 | Pendse ............ 257/737 |
| 2011/0115597 A1* | 5/2011 | Kamgaing ............ 336/200 |
| 2012/0002377 A1 | 1/2012 | French et al. |
| 2012/0068301 A1* | 3/2012 | Sin ............ H01L 23/645 257/531 |
| 2012/0235779 A1* | 9/2012 | Baram ............ H01F 5/003 336/200 |
| 2013/0001735 A1* | 1/2013 | Hopper et al. ............ 257/499 |

FOREIGN PATENT DOCUMENTS

| | | | |
|---|---|---|---|
| EP | 1519414 A1 | | 3/2005 |
| JP | 01042110 A | * | 2/1989 |
| JP | 09153406 A | * | 6/1997 |
| JP | 2001244123 A | | 9/2001 |
| JP | 2002110423 A | * | 4/2002 |
| JP | 2002280878 A | | 9/2002 |
| JP | 2003059744 A | * | 2/2003 |
| JP | 2003059744 A | | 2/2003 |
| JP | 2007506263 A | | 3/2007 |
| JP | 2012089700 A | | 5/2012 |
| JP | 2012195447 A | | 10/2012 |
| TW | 200635456 | | 10/2006 |
| TW | 200711072 | | 3/2007 |
| TW | 201222782 A | | 6/2012 |

OTHER PUBLICATIONS

Taiwan Search Report—TW103103804—TIPO—dated Feb. 7, 2015.
International Preliminary Report on Patentability—PCT/US2014/014270—The International Bureau of WIP Geneva, Switzerland, dated Jun. 16, 2015.
Taiwan Search Report—TW103103804—TIPO—dated Sep. 6, 2015.
Taiwan Search Report—TW105110591—Taiwan Intellectual Property Office—dated May 16, 2017.

* cited by examiner

SUBSTRATE-LESS DISCRETE COUPLED INDUCTOR STRUCTURE

The present application claims priority to U.S. Provisional Application No. 61/762,555 entitled "Substrate-less Discrete Coupled Inductor Structure", filed Feb. 8, 2013, which is hereby expressly incorporated by reference herein.

BACKGROUND

Field

Various features relate to a substrate-less discrete coupled inductor structure.

Background

Discrete coupled inductor have traditional been implemented using a ladder structure. As illustrated in FIG. 1, a ladder coupled inductor structure 102 may comprise a core 104 with a plurality of inductor windings 106a-d. However, such ladder structure 102 requires a custom core 104 and windings (e.g., coils). Relative to off-the-shelf inductors, the ladder structure 102 is relatively expensive. Additionally, when placing inductors within semiconductor devices, inductors taking up the smallest possible area are desired.

Consequently, there exists a need for an efficient but cost effective coupled inductor structure/configuration.

SUMMARY

Various features relate to an in substrate coupled inductor structure.

A first example provides an inductor structure that includes a first inductor winding that includes an electrically conductive material. The inductor structure also includes a second inductor winding that includes an electrically conductive material. The inductor structure also includes a filler laterally located between the first inductor winding and the second inductor winding. The filler is configured to provide structural coupling of the first and second inductor windings.

According to an aspect, the first inductor winding is laterally co-planar to the second inductor winding.

According to one aspect, the first inductor winding has a first spiral shape and the second inductor winding has a second spiral shape.

According to an aspect, the first inductor winding and the second inductor winding have an elongated circular shape.

According to one aspect, the first inductor winding includes a first terminal and a second terminal, and the second inductor winding includes a third terminal and a fourth terminal. In some implementations, the first terminal is coupled to a first end of the first inductor winding and the second terminal is coupled a second end of the first inductor winding.

According to an aspect, a thickness of the first inductor winding is less than 0.2 millimeters.

According to one aspect, the filler is an epoxy. In some implementations, the inductor structure is free of a substrate as a base portion for the inductor structure.

According to an aspect, the inductor structure is integrated on a package-on-package (PoP) structure. In some implementations, the inductor structure is integrated on a surface of a package substrate. In some implementations, the inductor structure is integrated inside a package substrate.

According to one aspect, the inductor structure is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a first inductive means, a second inductive means, and a filler laterally located between the first inductive means and the second inductive means. The filler is configured to provide structural coupling of the first and second inductive means.

According to an aspect, the first inductive means is laterally co-planar to the second inductive means.

According to one aspect, the first inductive means has a first spiral shape and the second inductive means has a second spiral shape.

According to an aspect, the first inductive means and the second inductive means have an elongated circular shape.

According to one aspect, the first inductive means includes a first terminal and a second terminal, and the second inductive means includes a third terminal and a fourth terminal. In some implementations, the first terminal is coupled to a first end of the first inductive means and the second terminal is coupled a second end of the first inductive means.

According to an aspect, a thickness of the first inductive means is less than 0.2 millimeters.

According to one aspect, the filler is an epoxy. In some implementations, the apparatus is free of a substrate as a base portion for the inductor structure.

According to an aspect, the apparatus is integrated on a package-on-package (PoP) structure. In some implementations, the apparatus is integrated on a surface of a package substrate. In some implementations, the apparatus is integrated inside a package substrate.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing an inductor structure. The method provides a substrate. The method also provides a first inductor winding and a second inductor winding on the substrate. The method provides a filler between the first inductor winding and the second inductor winding. The filler is configured to provide structural coupling of the first and second inductor windings.

According to an aspect, the method removes the substrate.

According to one aspect, providing the first inductor winding and the second inductor winding on the substrate includes providing a sacrificial layer above the substrate, selectively removing portions of the sacrificial layer, and providing a metal layer above the substrate and the sacrificial layer. The metal layer forms the first inductor winding and the second inductor winding. In some implementations, providing the first inductor winding and the second inductor winding includes removing the sacrificial layer.

According to an aspect, providing the first inductor winding and the second inductor winding includes providing the first inductor winding to be laterally co-planar to the second inductor winding.

According to one aspect, the first inductor winding has a first spiral shape and the second inductor winding has a second spiral shape.

According to an aspect, the first inductor winding and the second inductor winding have an elongated circular shape.

According to one aspect, the first inductor winding includes a first terminal and a second terminal, and the second inductor winding includes a third terminal and a fourth terminal. In some implementations, the first terminal is coupled to a first end of the first inductor winding and the second terminal is coupled a second end of the first inductor winding.

According to an aspect, the filler is an epoxy.

According to one aspect, the method further provides the inductor structure on a package-on-package (PoP) structure.

According to an aspect, the method further provides the inductor structure on a surface of a package substrate.

According to one aspect, the method further provides the inductor structure inside a package substrate.

According to an aspect, the method further provides the inductor structure into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a substrate-less inductor structure that includes a first inductor winding, a second inductor winding and a filler. The first inductor winding includes an electrically conductive material. The second inductor winding includes an electrically conductive material. The filler is laterally located between the first inductor winding and the second inductor winding. The filler is configured to provide structural coupling of the first and second inductor windings. The inductor structure is free of a substrate as a base portion for the inductor structure. In some implementations, the first inductor winding is laterally co-planar to the second inductor winding. In some implementations, the first inductor winding has a first spiral shape and the second inductor winding has a second spiral shape. In some implementations, the first inductor winding and the second inductor winding have an elongated circular shape. In some implementations, the filler is an epoxy.

Exemplary Coupled Inductor Structure

Figure 1:
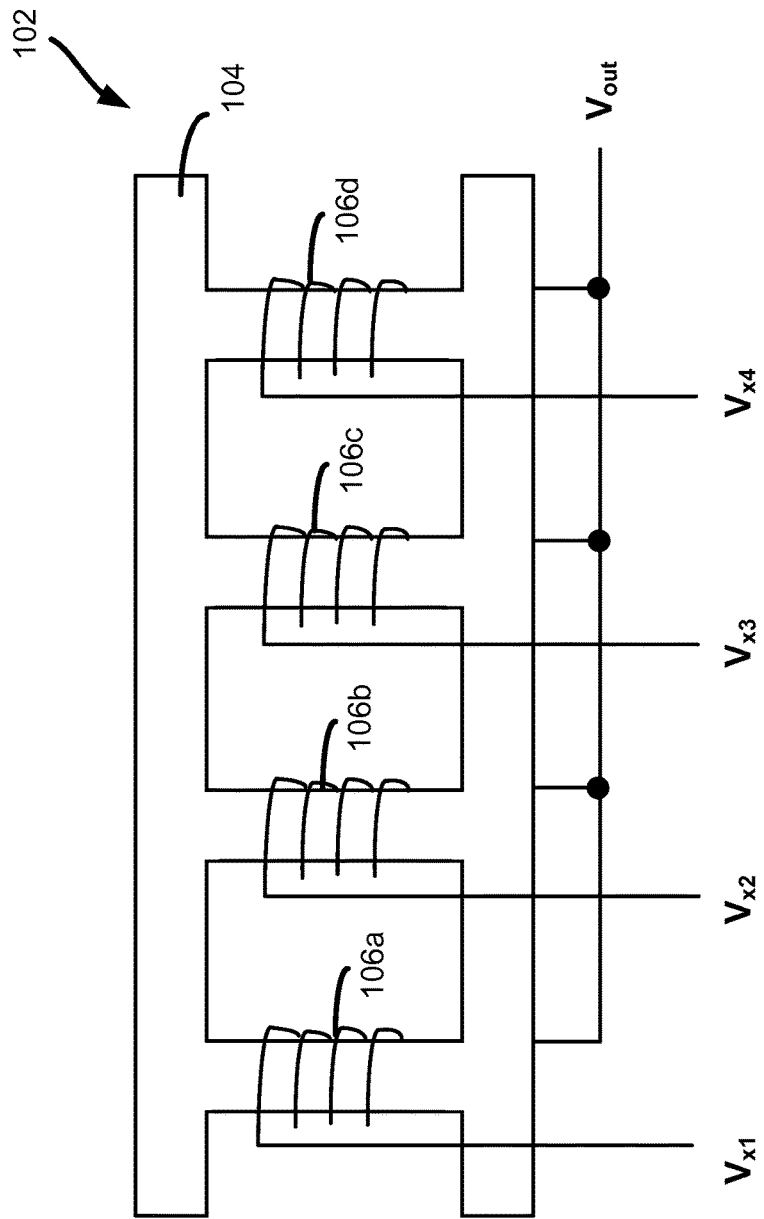
FIG. 1 illustrates a ladder structure inductor.
Figure 2:
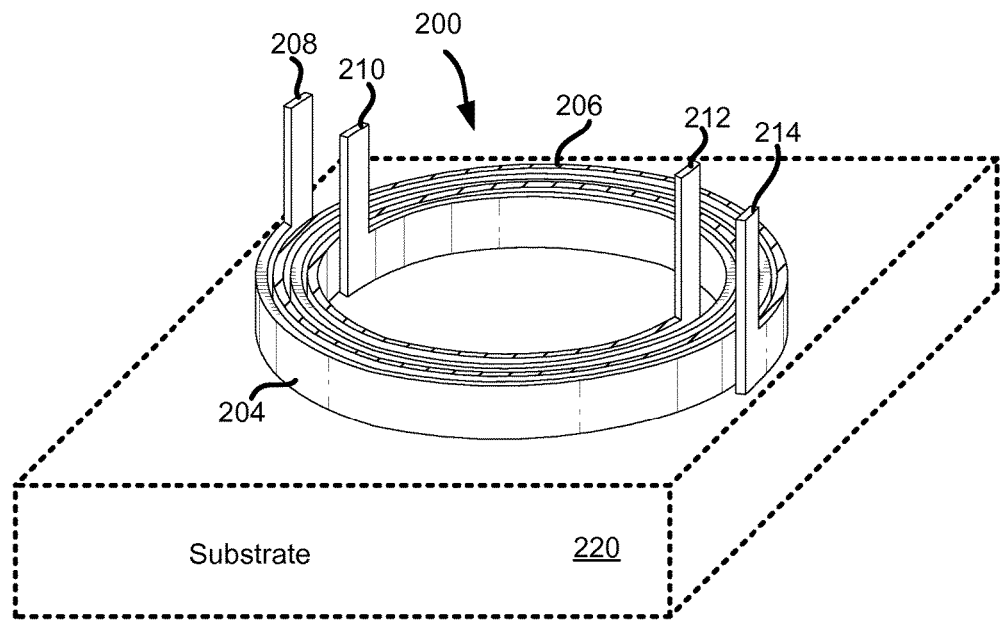
FIG. 2 illustrates an angled view of a substrate-less coupled inductor structure on a substrate.
Figure 3:
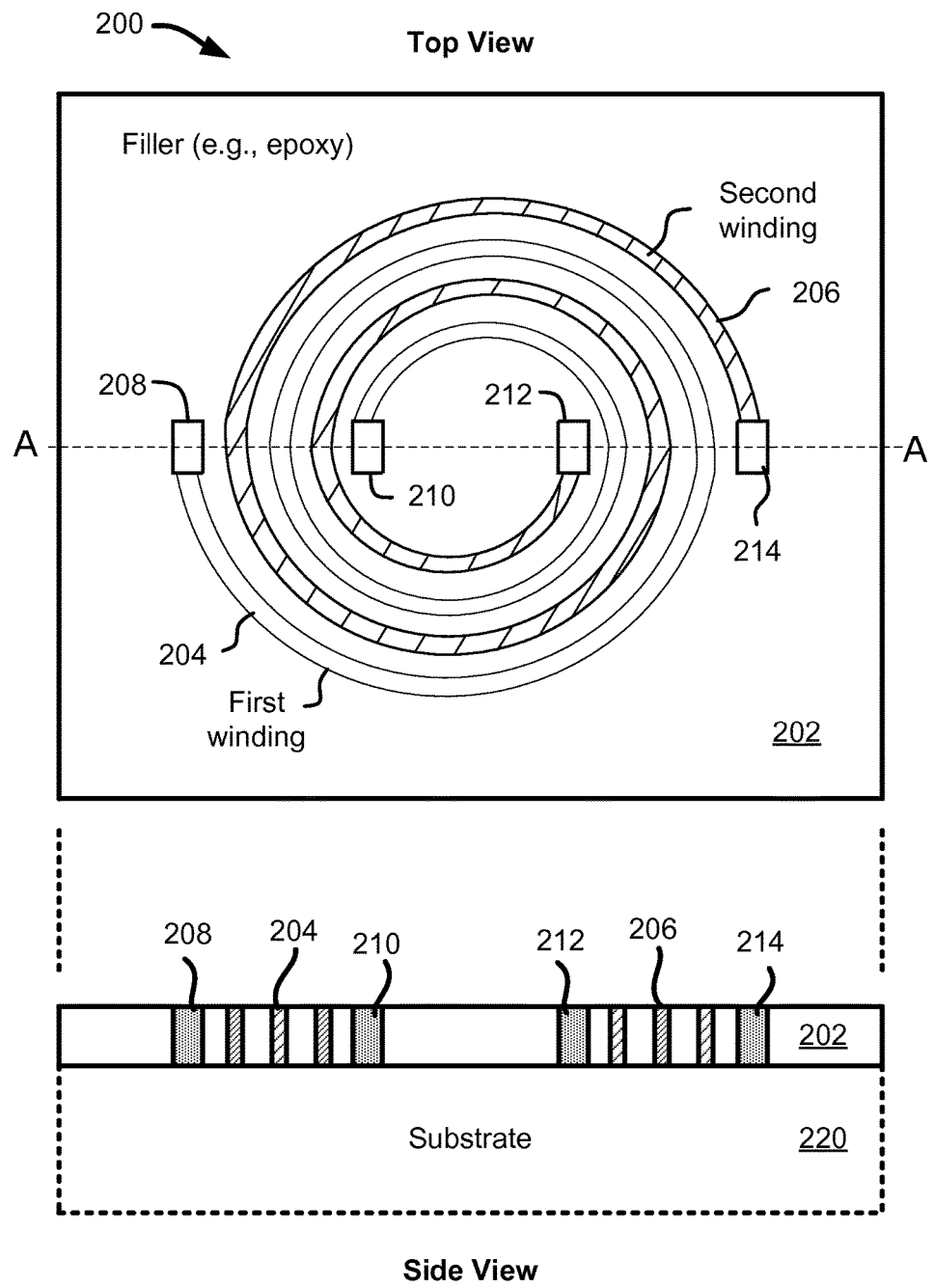
FIG. 3 illustrates top and side views of a substrate-less coupled inductor structure on a substrate.

FIGS. 2-3 illustrate an example of a coupled inductor structure. In some implementations, the coupled inductor structure is designed/arranged in such a way as to occupy a small effective footprint/real estate with better and/or improved coupling than the ladder structure shown and described in FIG. 1. More, specifically, some implementations provide a coupled inductor structure that is designed/arranged to be thinner than the ladder structure shown in FIG. 1. In some implementations, such a coupled inductor structure is substrate-less discrete coupled inductor structure that is free of a substrate (e.g., substrate as a base portion has been removed) or has a very thin substrate.

More specifically, FIG. 2 illustrates an angled view of a coupled inductor structure formed on a substrate (where the substrate is subsequently removed) and FIG. 3 illustrates top and side views of the coupled inductor structure on a substrate (where the substrate is subsequently removed). In some implementations, removing the substrate provides a coupled inductor structure that is relatively thin compared to other coupled inductor structures. In some implementations, the coupled inductor structure free of a substrate (e.g., without a substrate as a base) may have a thickness of 0.2 millimeters (mm) or less (200 microns (μm) or less). In some implementations, the substrate-less coupled inductor structure has a thickness of 90 microns (μm) or less.

FIG. 2 illustrates a coupled inductor structure 200 that includes a first inductor 204, a second inductor 206, and terminals 208-214. The first inductor 204 (e.g., first inductor winding) includes terminals 208-210. The second inductor 206 (e.g., second inductor winding) includes terminals 212-214. The first inductor 204 and the second inductor 206 are coupled together through a filler (which is not visible) that provides structural coupling, stability, and/or rigidity for the coupled inductor structure 200. In some implementations, the filler is an epoxy. In some implementations, the filler is between the first inductor 204 and the second inductor 306 and holds the first and second inductors 204-206 together, allowing lateral energy coupling (e.g., energy transfer) between the two inductors 204-206.

FIG. 2 also illustrates that the coupled inductor structure is formed on a substrate 220. The substrate 220 is shown as dotted lines to illustrate that the substrate 220 is removed after the inductors 204-206 are formed. In some implementations, the substrate 220 is removed (e.g., etched, grinned) in order to provide a coupled inductor structure 200 that is as thin as possible.

FIG. 3 illustrates how a filler may provide structural coupling, stability and/or rigidity for the coupled inductor structure 200. As noted above, FIG. 3 illustrates top and side views of the coupled inductor structure on a substrate (which is subsequently removed or thinned). The side view of the coupled inductor structure 200 is along the AA cross section of the top view of the coupled inductor structure 200.

As shown in FIG. 3, the coupled inductor structure 200 includes a filler 202, a first inductor 204 and a second inductor 206. The filler 202 provides structural coupling, stability and/or rigidity for the coupled inductor structure 200. For example, the filler 202 allows the first and second inductors 204-206 to be physically coupled together, allowing energy coupling between the first and second inductors 204-206. The energy coupling is further described below.

The coupled inductor structure 200 is formed on a substrate 220 (which is subsequently removed or thinned). The substrate 220 may be a silicon substrate. The first inductor 204 is defined by a first inductor winding (e.g., coils). The second inductor 206 is defined by a second inductor winding (e.g., coils). The first and second inductor windings may have electrically conductive material (e.g., metal, such as copper). The first winding of the first inductor 204 has a shape of a first spiral. The second winding of the second inductor 206 has a shape of a second spiral. It should also be noted that different implementations may use different shapes for the windings of the inductors. For example, in some implementations, the inductor windings may have an elongated circular shape (e.g., race track shape). The shape of the inductor windings may also be concentric, square, rectangular, oval, or other non-circular shapes.

In some implementations, the first spiral of the first inductor 204 and the second spiral of the second inductor 206 are positioned on the substrate 220 (the substrate 220 being subsequently removed) that there is lateral energy coupling between the first inductor 204 and the second inductor 206. That is, the first inductor 204 may be configured to induce a current in the second inductor 206. In some implementations, lateral energy coupling refers to the transfer of energy between two inductors along the same plane (e.g., co-planar, along the same layer). In some implementations, a lateral coupled inductor structure is an inductor structure where energy transfer between two inductors occurs mostly (e.g., majority), or substantially along the same plane. In addition to providing a small footprint, a lateral coupled inductor structure may provide better coupling efficiency than other types of coupled inductor structures (e.g., vertical coupling inductor structure). Some of the properties of an inductor and/or coupled inductor structure include effective inductance, Q factor and/or effectiveness of the coupling of the inductor structure. The effectiveness of an inductor and/or inductor structure may be defined by its Q factor. A Q factor is a quality factor/value that defines the efficiency of an inductor. The higher the Q factor, the closer the inductor approaches the behavior of an ideal inductor, which is a lossless inductor. Thus, generally speaking, a higher Q factor is more desirable than a lower Q factor.

In some implementations, the first inductor 204 is the primary inductor in the inductor structure and the second inductor 206 is the secondary inductor the inductor structure. In such a configuration, the first inductor 204 (e.g., primary inductor) may induce a voltage/current in the second inductor 206 (e.g., secondary inductor). Alternatively, in some implementations, the first inductor 204 may be the secondary inductor in the inductor structure and the second inductor 206 may be the primary inductor in the inductor structure. In such a configuration, the second inductor 206 may induce a voltage/current in the first inductor 204.

Each inductor 204-206 also includes a set of pins/terminals (e.g. an input terminal and an output terminal). Specifically, the first inductor 204 includes a first input terminal 208 (e.g., $V_{x1}$) and a first output terminal 2010 (e.g., $V_{out1}$), and the second inductor 206 includes a second input terminal 214 (e.g., $V_{x2}$) and a second output terminal 212 (e.g., $V_{out2}$). However, it should be noted that different implementations may use different input and out terminal positions. For example, in some implementations, the terminal 208 may be an output terminal and the terminal 210 may be an input terminal.

The coupled inductor structure 200 may also include one or more ferromagnetic layers (not shown). For example, a first ferromagnetic layer may be located on top of the substrate 202 and a second ferromagnetic layer may be located on a bottom of the substrate 202. In some implementations, the first and second ferromagnetic layers may be positioned above/below the filler between the inductors 204-206. The first and second ferromagnetic layers may not be electrically coupled to the inductors 204-206. The first and second ferromagnetic layers may be configured to reduce losses due to metal proximity (Faraday Cage). The first and second ferromagnetic layers may also provide shielding of the first and second inductors 204-206, which helps increase the effective inductance, the Q factor and/or effectiveness of the coupling of the coupled inductor structure 200 in some implementations. As described above, the effectiveness of an inductor may be defined by its Q factor. A Q factor is a quality factor/value that defines the efficiency of an inductor. The higher the Q factor, the closer the inductor approaches the behavior of an ideal inductor, which is a lossless inductor. Thus, generally speaking, a higher Q factor is more desirable than a lower Q factor. In some implementations, the use of the first and second ferromagnetic layers help increase the Q factor (e.g., increase effective inductance) of the coupled inductor structure 200 and provide magnetic shielding. In some implementations, the magnetic shielding keeps (e.g., concentrates) the magnetic field generated by one or more of the inductors 204-206 within the coupled inductor structure, which increases the effective impedance (e.g., increase Q factor) of the inductor structure.

The first and second ferromagnetic layers may have high permeability (μ) and/or high B saturation. In some implementations, the permeability of a material refers to the degree of magnetization that the material obtains in response to an applied magnetic field. In some implementations, the B saturation of a material refers to the state that the material reaches when an increase in magnetic field no longer increases the magnetization of the material. An example of a ferromagnetic material could be silicon steel, Manganese-zinc ferrite (MnZn), and/or permalloy. In some implementations, the first and second ferromagnetic layers are magnetic foils.

Having described a substrate-less coupled inductor structure, a sequence and methods for manufacturing/providing substrate-less coupled inductor structures will now be described below.

Figure 4A:
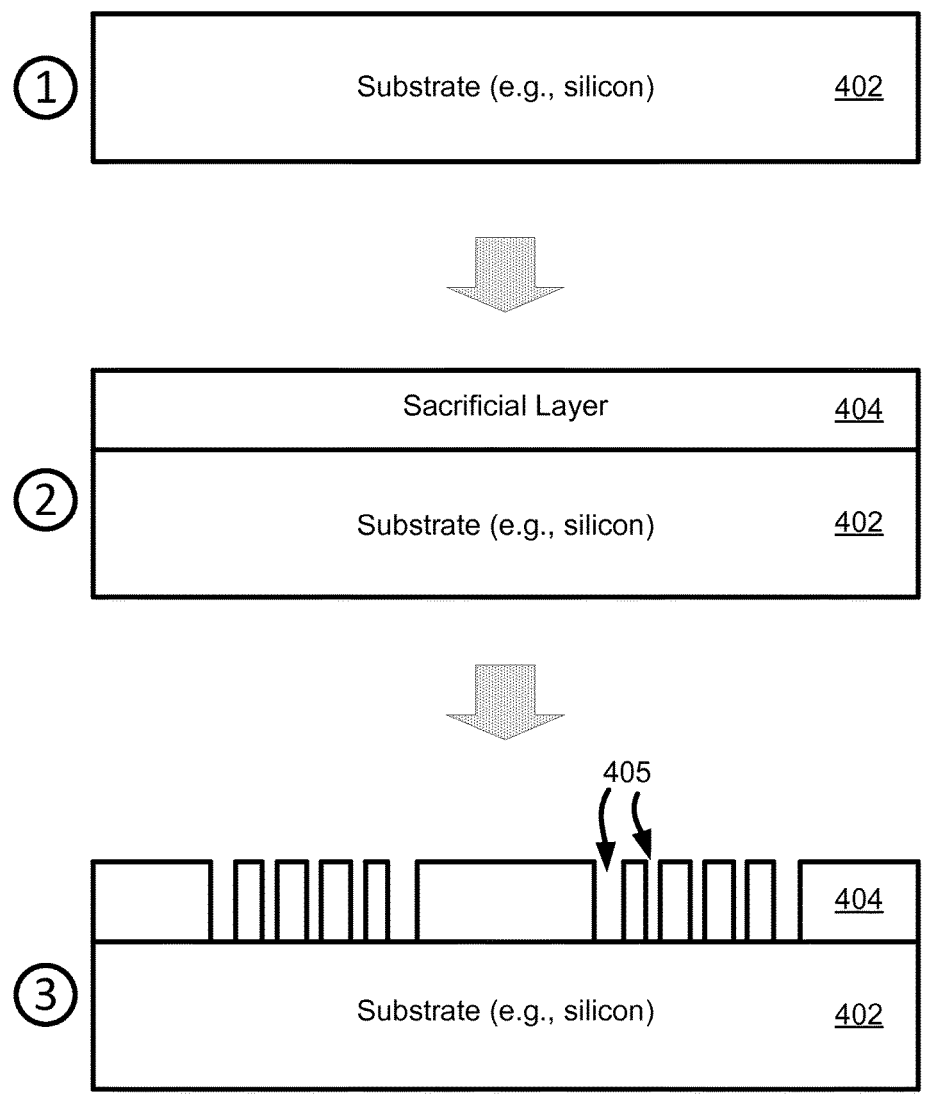
FIGS. 4A-4C illustrate a sequence for providing/manufacturing a substrate-less coupled inductor structure.
Figure 4B:
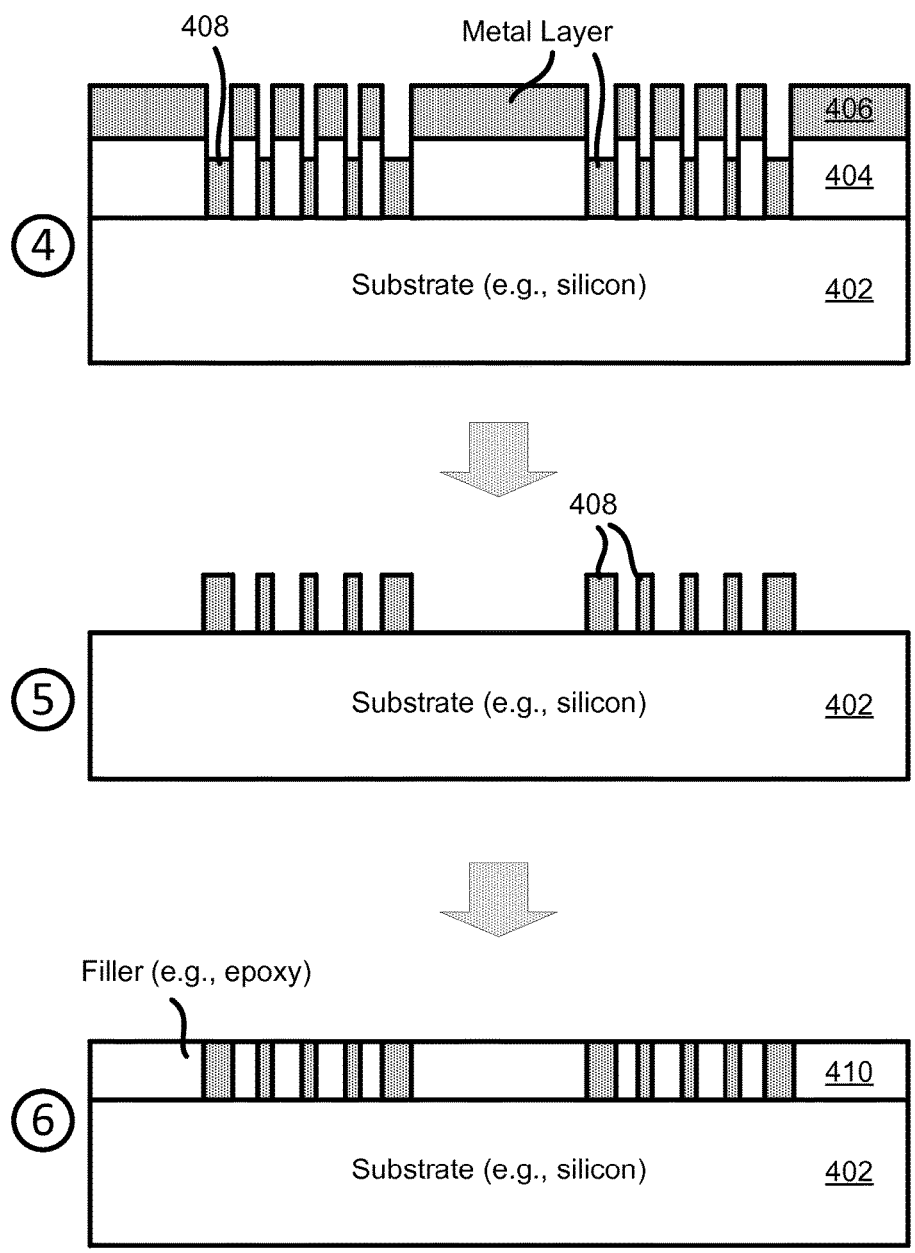
Figure 4C:
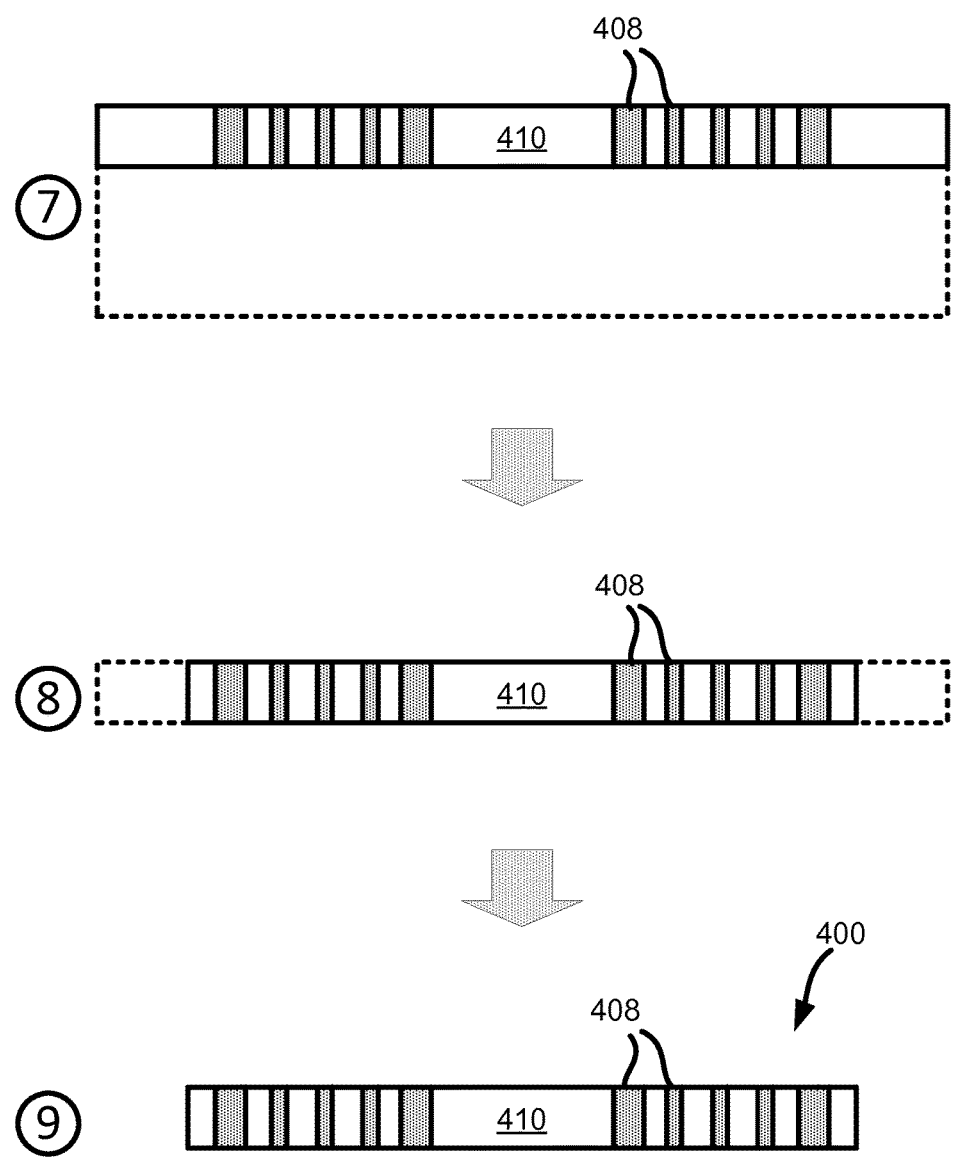

Exemplary Sequence for Providing/Manufacturing a Substrate-Less Coupled Inductor Structure FIGS. 4A-4C illustrates a sequence for providing/manufacturing a substrate-less coupled inductor structure. In some implementations, the sequence of FIGS. 4A-4C may be used to manufacture the coupled inductor structure 200 of FIGS. 2-3. However, the sequence of FIGS. 4A-4C may be applicable to other coupled inductor structures.

The sequence starts at stage 1 of FIG. 4A with a substrate 402. The substrate 402 may be a silicon substrate in some implementations. Different implementations may use different substrates. In some implementations, the substrate 402 may be thinned.

At stage 2, a sacrificial layer 404 is provided (e.g., deposited) above the substrate 402. The sacrificial layer 404 may be a photoresist layer in some implementations. Different implementations may use different materials for the photoresist layer.

At stage 3, patterns 405 are formed in the sacrificial layer 404. The patterns 405 may be cavities and/or trenches in the sacrificial layer 404. Different implementations may use different methods for creating/forming the patterns 405. In some implementations, the patterns are etched/drilled in the sacrificial layer 404. For example, a laser may be used to etch and/or drill in the sacrificial layer 404. In some implementations, lithography is used to etch the patterns 405 in the sacrificial layer 404. The etching may also be performed by a chemical process in some implementations.

As shown in FIG. 4B, at stage 4, a metal layer 406 is deposited above the substrate 402. The metal layer 406 may fill some or all of the patterns 405 created in the sacrificial layer 404. In some implementations, the metal layer 406 may also be deposited above the sacrificial layer 404. Different implementations may use different materials for the metal layer 406. For example, the metal layer 406 may be copper in some implementations.

At stage 5, the sacrificial layer 404 and the metal layer 406 above the sacrificial layer 404 is removed, leaving only the remaining metal 408. Different implementations may use different methods for removing (e.g., etching) the sacrificial layer 404 and the metal layer 406. For examples, a chemical process may be used to "wash out" the remaining the sacrificial layer 404. During the process of "washing out" the sacrificial layer 404, the metal layer above the sacrificial layer 404 is also removed in some implementations. As shown in stage 5, after the sacrificial layer 404 is removed, the remaining metal layer now becomes the components 408 of the inductor structure. For example, the components 408 may be windings of the first inductor and/or the second inductor. In addition, the components 408 may also be the terminals of the first inductor and/or the second inductor in some implementations.

At stage 6, a filler 410 is provided between the components 408 (e.g., between the windings of the first and second inductors). The filler 410 may be an epoxy in some implementations. The filler 410 may be configured to provide structural coupling, stability, and/or rigidity for the coupled inductor structure in some implementations. That is in some implementations, the filler 410 may be configured to allow the coupled inductor structure to have structural integrity in the absence of a substrate as a base portion. For example, the filler 410 may allow a first inductor to be physically coupled to the second inductor.

As shown in FIG. 4C, at stage 7, the substrate 402 is removed (e.g., etched) from the coupled inductor structure. The removal of the substrate 402 is represented by the dotted lines defining where the substrate 402 was previously located. Different implementations may use different methods for removing the substrate. In some implementations, a laser may be used to etch away the substrate 402. In some implementations, only a portion of the substrate is removed. For example, in some implementations, the substrate is thinned, instead of being completely removed.

At stage 8, portions of the filler 410 is removed. The removal of portions of the filler 410 is represented by the dotted lines defining where the portions was previously located. Different implementations may use different methods for removing portions of the filler 410. For example, a laser may be used to remove portions of the filler 410. Portions of the filler 410 may be removed to further decrease the size and/or area of the coupled inductor structure.

Stage 9 illustrates an exemplary coupled inductor structure 400 after the substrate has been removed. As shown in stage 9, the substrate-less coupled inductor structure includes components 408 (which may include windings for first and second inductors) and a filler 410 that physically couples the components 408 together (e.g., physically couples windings of the first inductor to windings of the second inductor).

It should also be noted that in some implementations, one or more ferromagnetic layers may be provided (e.g., deposited) on the coupled inductor structure 400. The ferromagnetic layers may be provided above and/or below the coupled inductor structure 400. Different implementations may provide the ferromagnetic layers during different stages of the manufacturing of the coupled inductor structure. In some implementations, one or more ferromagnetic layers may be provided on a filler (e.g., after stage 6 of FIG. 4B). In some implementations, one or more ferromagnetic layers may be provided after the substrate is removed and/or thinned (e.g., after stage 7 of FIG. 4C).

Figure 5:
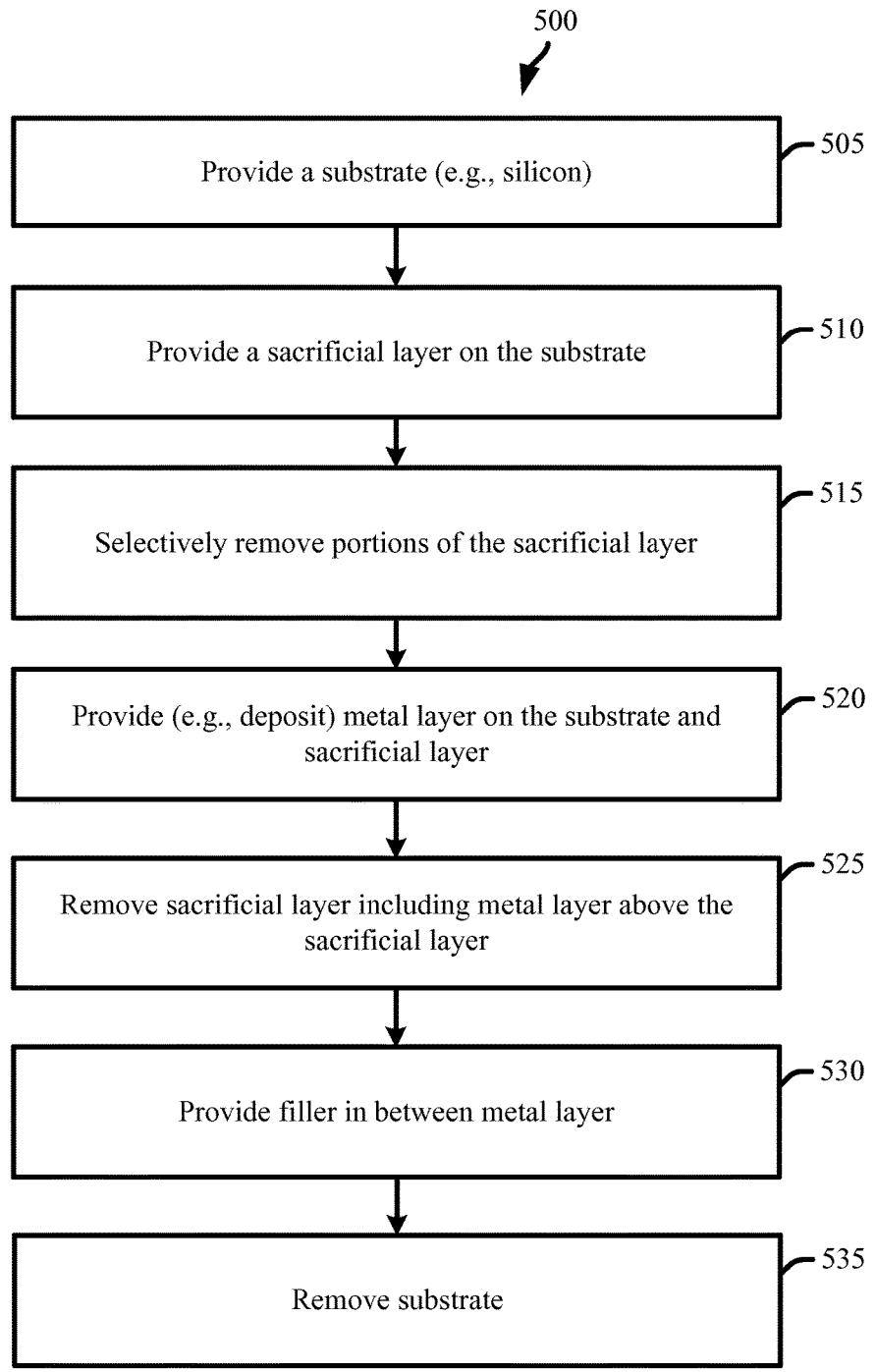
FIG. 5 illustrates a flow diagram for providing/manufacturing a substrate-less coupled inductor structure.

Exemplary Method for Providing/Manufacturing a Substrate-Less Coupled Inductor Structure FIG. 5 illustrates a flow diagram of a method for providing/manufacturing a substrate-less coupled inductor structure. In some implementations, the method of FIG. 5 is used to manufacture/provide the substrate-less coupled inductor structure 200 of FIGS. 2-3 and the substrate-less coupled inductor structure 400 of FIGS. 4A-4C.

The method provides (at 505) a substrate (e.g., substrate 402). The substrate may be a silicon substrate in some implementations. Different implementations may use different substrates. In some implementations, the substrate may be thinned.

The method further provides (at 510) a sacrificial layer (e.g., sacrificial layer 404) above the substrate. In some implementations, providing the sacrificial layer includes depositing the sacrificial layer on the substrate. The sacrificial layer may be a photoresist layer in some implementations. Different implementations may use different materials for the photoresist layer.

The method selectively removes (at 515) portions of the sacrificial layer. In some implementations, selectively removing portions of the sacrificial layer includes creating/forming patterns (e.g., patterns 405) in the sacrificial layer. The patterns may be cavities and/or trenches in the sacrificial layer. Different implementations may use different methods for selectively removing portions of the sacrificial layer, creating/forming the patterns. In some implementations, the patterns are etched/drilled in the sacrificial layer. For example, a laser may be used to etch and/or drill in the sacrificial layer. In some implementations, lithography is used to etch the patterns in the sacrificial layer. The etching may also be performed by a chemical process in some implementations.

The method provides (at 520) a metal layer (e.g., metal layer 406) above the substrate. In some implementations, providing the metal layer includes depositing a metal layer above the substrate. The metal layer may fill some or all of the patterns created in the sacrificial layer when selected portions of the sacrificial layer were removed (at 515). In some implementations, the metal layer may also be deposited above the sacrificial layer. Different implementations may use different materials for the metal layer. For example, the metal layer may be copper in some implementations.

The method removes (at 525) the sacrificial layer and the metal layer above the sacrificial layer. Different implementations may use different methods for removing (e.g., etching) the sacrificial layer and the metal layer. For example, a chemical process may be used to "wash out" the remaining the sacrificial layer. During the process of "washing out" the sacrificial layer, the metal layer above the sacrificial layer is also removed in some implementations. After the sacrificial layer is removed, the remaining metal layer now becomes the components (e.g., components 408) of the inductor structure. For example, the components (e.g., components 408) may be windings of the first inductor and/or the second inductor. In addition, the components may also be the terminals of the first inductor and/or the second inductor in some implementations.

The method provides (at 530) a filler (e.g., filler 410) between the metal layer that define the components of the coupled inductor structure (e.g., between the windings of the first and second inductors). In some implementations, providing the filler includes depositing a filler in between the metal layer that defines the components of the coupled inductor structure. The filler may be an epoxy in some implementations. The filler may be configured to provide structural coupling, stability, and/or rigidity for the coupled inductor structure in some implementations. That is, in some implementations, the filler may be configured to allow the coupled inductor structure to have structural integrity in the absence of a substrate as a base portion. For example, the filler may allow a first inductor (e.g., first inductor winding) to be physically coupled to the second inductor (e.g., second inductor winding).

The method removes (at 535) the substrate from the coupled inductor structure. Different implementations may use different methods for removing the substrate. In some implementations, a laser may be used to etch away the substrate. In addition to removing the substrate, some implementations may also remove portions of the filler. Portions of the filler may be removed to further decrease the size and/or area of the coupled inductor structure.

Having described a specific method for providing/manufacturing a substrate-less coupled inductor structure, a general method for providing/manufacturing a substrate-less coupled inductor structure will now be described below.

Figure 6:
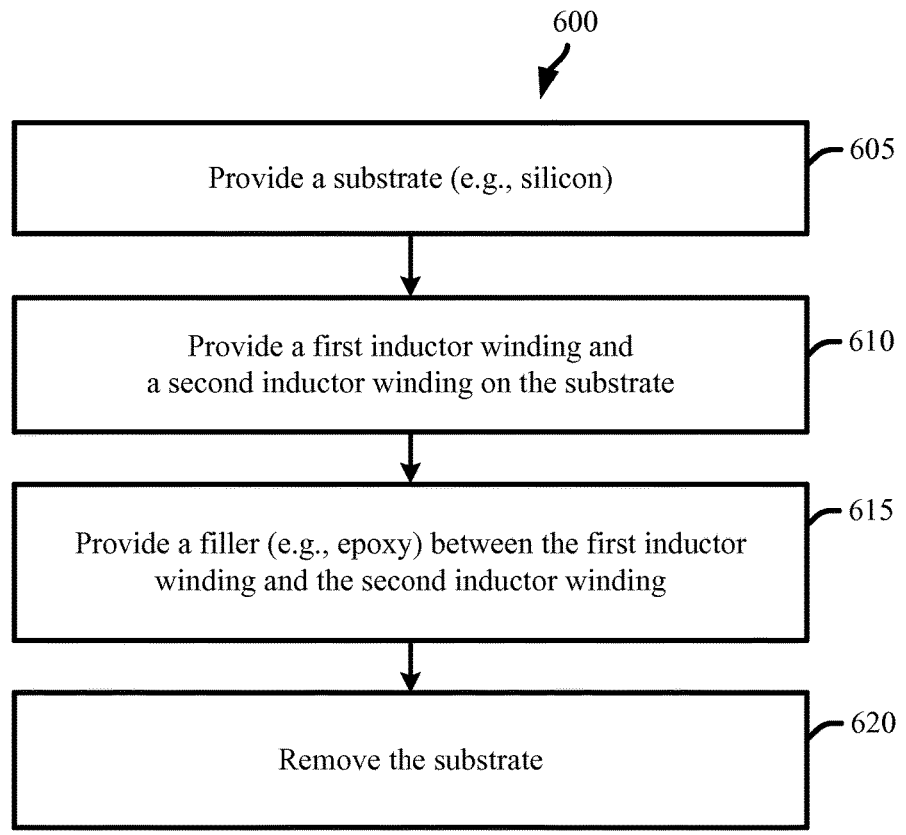
FIG. 6 illustrates another flow diagram for providing/manufacturing a substrate-less coupled inductor structure.

Exemplary Method for Providing/Manufacturing a Substrate-Less Coupled Inductor Structure FIG. 6 illustrates a flow diagram of a method for providing/manufacturing a substrate-less coupled inductor structure. In some implementations, the method of FIG. 6 is used to manufacture/provide the substrate-less coupled inductor structure 200 of FIGS. 2-3 and the substrate-less coupled inductor structure 400 of FIGS. 4A-4C.

The method provides (at 605) a substrate (e.g., substrate 402). The substrate may be a silicon substrate in some implementations. Different implementations may use different substrates. In some implementations, the substrate may be thinned.

The method further provides (at 610) a first inductor winding and a second inductor winding on the substrate. Different implementations may provide the first inductor winding and the second inductor winding on the substrate differently. In some implementations, providing the first and second inductor windings includes providing (e.g., depositing) a sacrificial layer above the substrate. The sacrificial layer may be a photoresist layer in some implementations. Different implementations may use different materials for the photoresist layer.

In some implementations, providing the first and second inductor windings also includes providing selectively removing portions of the sacrificial layer. In some implementations, selectively removing portions of the sacrificial includes creating/forming patterns (e.g., patterns 405) in the sacrificial layer. The patterns may be cavities and/or trenches in the sacrificial layer. Different implementations may use different methods for selectively removing portions of the sacrificial layer, creating/forming the patterns. In some implementations, the patterns are etched/drilled in the sacrificial layer. For example, a laser may be used to etch and/or drill in the sacrificial layer. In some implementations, lithography is used to etch the patterns in the sacrificial layer. The etching may also be performed by a chemical process in some implementations.

In some implementations, providing the first and second inductor windings includes providing a metal layer (e.g., metal layer 406) above the substrate. In some implementations, providing the metal layer includes depositing a metal layer above the substrate. The metal layer may fill some or all of the patterns created in the sacrificial layer when selected portions of the sacrificial layer were removed. In some implementations, the metal layer may also be deposited above the sacrificial layer. Different implementations may use different materials for the metal layer. For example, the metal layer may be copper in some implementations.

In some implementations, providing the first and second inductor windings further includes providing removing the sacrificial layer and the metal layer above the sacrificial layer. Different implementations may use different methods for removing (e.g., etching) the sacrificial layer and the metal layer. For example, a chemical process may be used to "wash out" the remaining the sacrificial layer. During the process of "washing out" the sacrificial layer, the metal layer above the sacrificial layer is also removed in some implementations. After the sacrificial layer is removed, the remaining metal layer now becomes the components (e.g., components 408) of the inductor structure. For example, the components (e.g., components 408) may be windings of the first inductor and/or the second inductor. In addition, the components may also be the terminals of the first inductor and/or the second inductor in some implementations.

The method provides (at 615) a filler between the first inductor winding and the second inductor winding. In some implementations, providing (at 615) the filler includes depositing a filler (e.g., filler 410) between the metal layer that defines the components of the coupled inductor structure. The filler may be an epoxy in some implementations. The filler may be configured to provide structural coupling, stability, and/or rigidity for the coupled inductor structure in some implementations. That is, in some implementations, the filler may be configured to allow the coupled inductor structure to have structural integrity in the absence of a substrate as a base portion. For example, the filler may allow a first inductor (e.g., first inductor winding) to be physically coupled to the second inductor (e.g., second inductor winding).

The method removes (at 620) the substrate from the coupled inductor structure. Different implementations may use different methods for removing the substrate. In some implementations, a laser may be used to etch away the substrate. In addition to removing the substrate, some implementations may also remove portions of the filler. Portions of the filler may be removed to further decrease the size and/or area of the coupled inductor structure. In some implementations, removing the substrate includes remove a portion of the substrate (e.g., thinning the substrate).

Exemplary Substrate-Less Coupled Inductor Structure on Package-on-Package

Figure 7:
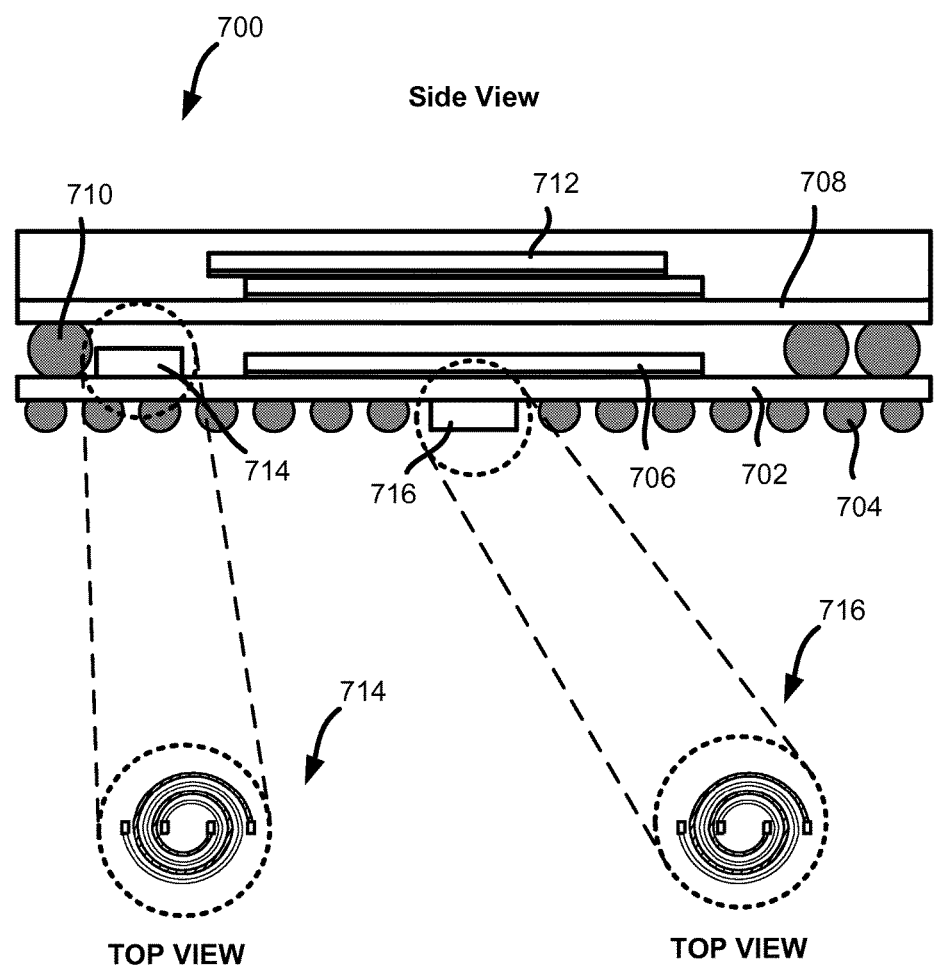
FIG. 7 illustrates a substrate-less coupled inductor structure on a package on package (PoP) structure.

In some implementations, one or more of the coupled inductor structures (e.g., inductor structure 200) may be coupled on a substrate within a package-on-package (PoP) structure. FIG. 7 illustrates a side view of a package-on-package (PoP) structure 700 that includes coupled inductor structures. As illustrated in FIG. 7, the PoP structure includes a first package substrate 702, a first set of solder balls 704, a first die 706, a second package substrate 708, a second set of solder balls 710, a second set of dice 712, a first inductor structure 714, and a second inductor structure 716. The first and second inductor structures 714-716 may be the inductor structure 200 and/or 400 of FIGS. 2-3 and FIGS. 4A-C. The first die 706 may be a logic die. The second set of dice 716 may be stacked memory dice in some implementations.

The first package of the PoP structure 700 may include the first package substrate 702, the first set of solder balls 704 and the first die 706. The first package of the PoP structure 700 may also include the first and second inductor structures 714-716. The first die 706 may be an Application Specific Integrated Circuit (ASIC) die in some implementations. The first inductor structure 714 may be integrated on the top surface of the first package substrate 702. As shown in FIG. 7, one or more solder balls may be removed to place the first inductor structure 714 on the top surface of the first package substrate 702.

An inductor structure may also be located on the bottom surface of a package substrate. As further shown in FIG. 7, the second inductor structure 716 is located on the bottom surface of the first package substrate 702. One or more of the first set of solder balls 710 may be removed to allow the second inductor structure 716 to be placed on the bottom of the first package substrate 702.

Figure 8:
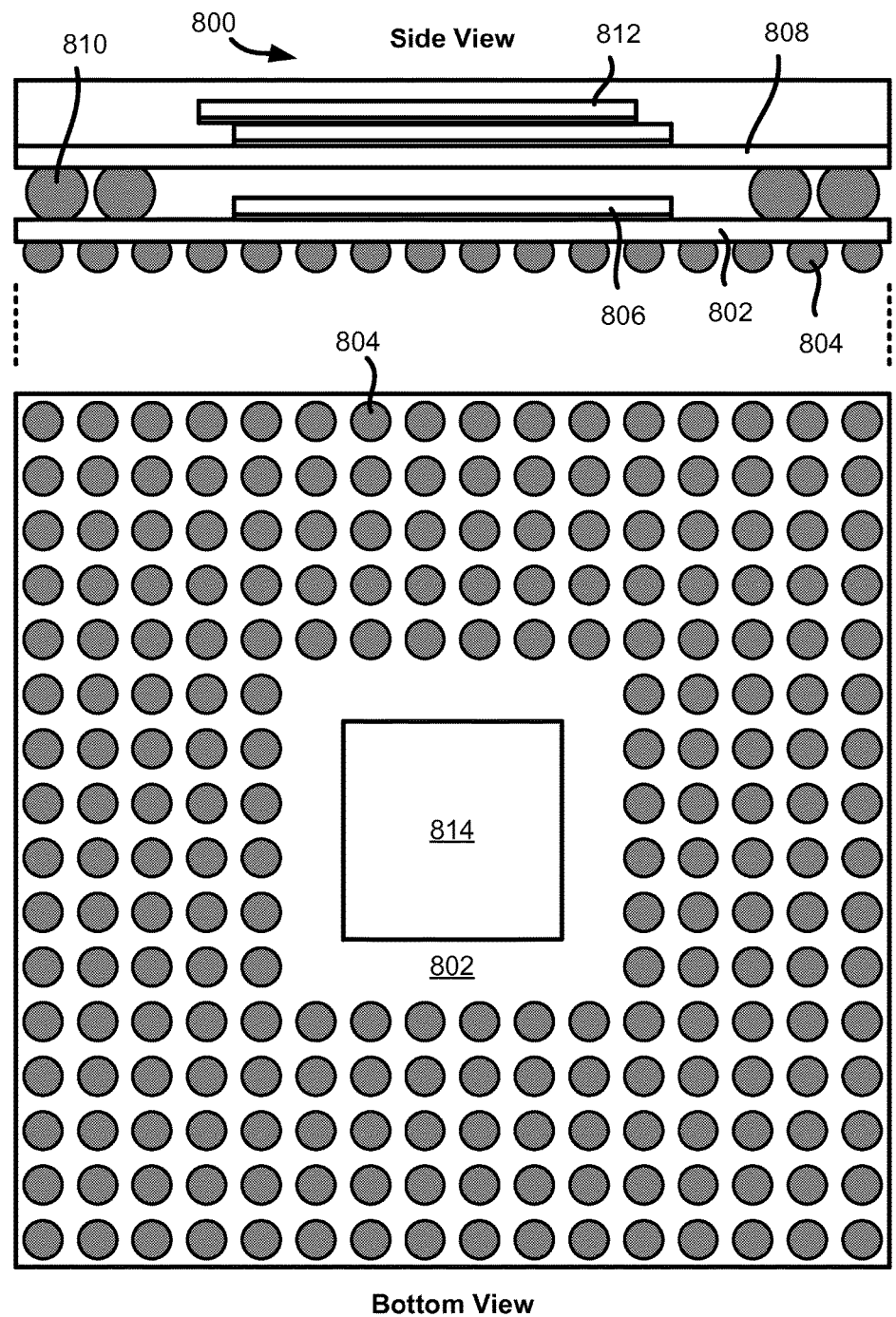
FIG. 8 illustrates another substrate-less coupled inductor structure on a package on package (PoP) structure.

FIG. 8 illustrates a side view and a bottom view of another package-on-package (PoP) structure 800 that includes coupled inductor structures. As illustrated in FIG. 8, the PoP structure includes a first package substrate 802, a first set of solder balls 804, a first die 806, a second package substrate 808, a second set of solder balls 810, a second set of dice 812, and an inductor structure 814. The first inductor structures 814 may be the inductor structure 200 and/or 400 of FIGS. 2-3 and FIG. 4A-C. The first die 706 may be a logic die. The second set of dice 716 may be stacked memory dice in some implementations.

As shown in FIG. 8, the inductor structure 814 is located on a bottom portion/surface of the first package substrate 802. The inductor structure 814 is surrounded by the first set of solder balls 804. FIG. 8 also illustrates that some of the solder balls from the first set of solder balls 804 have been removed in order to make room for the inductor structure 814. The inductor structure 814 of FIG. 8 may conceptually represent one inductor structure or several inductor structures.

Exemplary Substrate-Less Coupled Inductor Structure on Package

Figure 9:
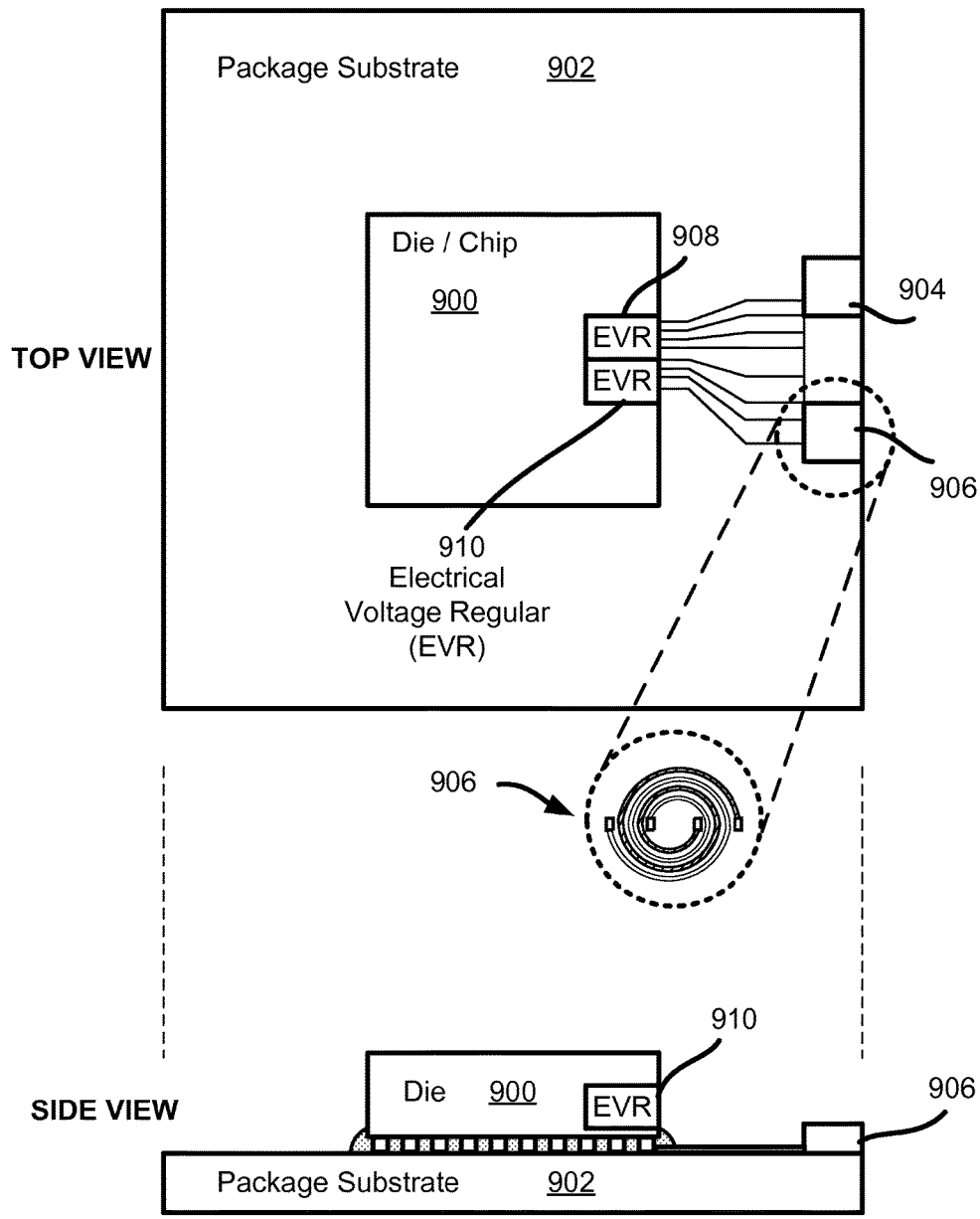
FIG. 9 illustrates at least one substrate-less coupled inductor structure on a package substrate.

In some implementations, one or more of the coupled inductor structures (e.g., inductor structure 200, 400) may be coupled on a substrate within a semiconductor package. As illustrated in FIG. 9, a die/chip 900 may be mounted on a package substrate 902. FIG. 9 also illustrates two coupled inductor structures on the surface of the package substrate 902. Specifically, FIG. 9 illustrates a first structure 904 and a second structure 906 on the package substrate 902. The first and second structures 904-906 are coupled to the die 900 through a set of wiring (e.g., traces). In some implementations, the first and second structures 904-906 may each be the inductor structure (e.g., inductor structure 200, 400) shown and described in FIGS. 2-3 and/or FIGS. 4A-4C.

In some implementations, one or more of the inductors from the inductor structure 904-906 may operate on different voltages. In some implementations, one or more electrical voltage regulators (EVRs) 908-910 may be used to regulate the voltage/current that is provided (e.g., supplied) to one or more of the inductors in the inductor structures 904-906. In one example, a first EVR 908 may be used to regulate and/or provide a voltage/current to the first structure 904. The first EVR 908 may also regulate the phase of the voltage/current that is provided to one or more inductors of the first structure 904. Similarly a second EVR 910 may be used to regulate and/or a voltage to the second structure 906. The second EVR 910 may also regulate the phase of the voltage/current that is provided to one or more inductors of the first structure 906. As shown in FIG. 9, the first and second EVRs 908-910 are located on the die 900. However, in some implementations, the EVRs 908-910 may be coupled to the die 900 but physically separate from the die 900. As further shown in FIG. 9, in some implementations, the combined dimensions of the first and second EVRs 908-910 may be 2 mm×2 mm or less. However, different implementations may have EVRs 908-910 with different dimensions.

In some implementations, the spacing between the die 900 and one or both of the structures 904-906 is 2 mm or less. The spacing may be defined as the edge to edge distance between two components (e.g., distance between the edge of a die and the edge of structure). In some implementations, the spacing between the die 900 and the outer edge of the structure (e.g., structure 904) is greater than 8 mm and lesser than 5 mm. However, different implementations may have different spacing between the die 900 and one or more of the structure 904-906.

Figure 10:
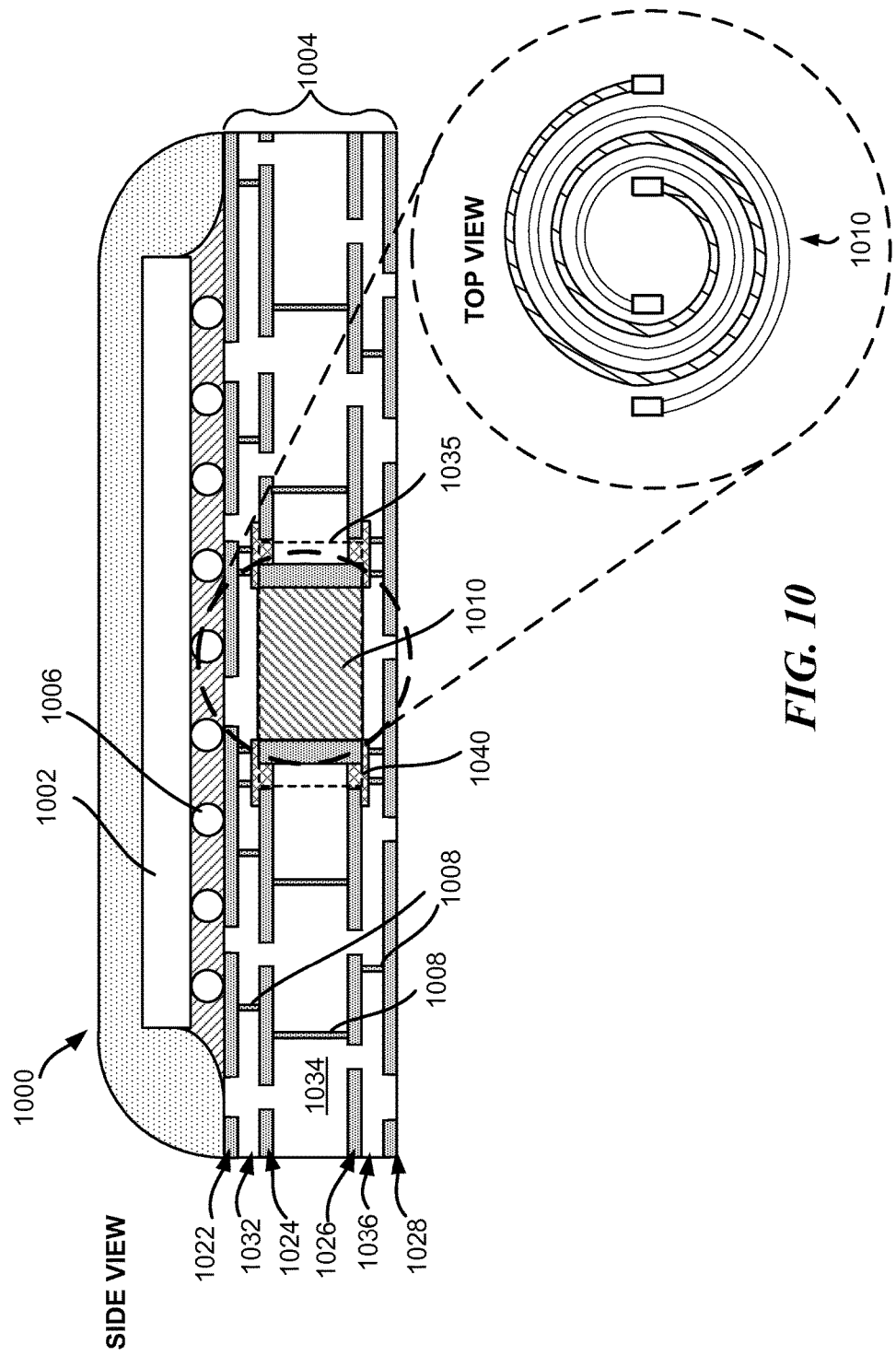
FIG. 10 illustrates at least one substrate-less coupled inductor structure integrated in a package substrate.

In some example, the substrate 902 may be part of an encapsulated package substrate (EPS) (which is further described below with reference to FIGS. 10-11). Consequently, the thickness of the inductor structures 902-904 is kept to less than or equal to the thickness of die/chip 900 (e.g., 0.2 mm or less) in some implementations.

Having described an exemplary coupled inductor structure, several package substrates that include such coupled inductor structures will now be described below.

Exemplary Package Substrate with Substrate-Less Coupled Inductor Structure

In some implementations, one or more of the coupled inductor structures (e.g., inductor 200, 400) may be coupled inside a substrate (e.g., package substrate) within a semiconductor package. FIGS. 10-11 illustrate examples of a coupled inductors structure in a substrate in some implementations. Specifically, FIG. 10 illustrates a cross-sectional, schematic view of an IC package 1000 according to one aspect of the disclosure. The IC package 1000 includes an IC die 1002 (e.g., memory circuit, processing circuit, applications processor, etc.) for an electronic device, such as, but not limited to, a mobile phone, laptop computer, tablet computer, personal computer, etc. The IC package 1000, and in particular, the IC die 1002 may be supplied power (e.g., provided nominal supply voltages and currents) from a power management integrated circuit (PMIC) (not shown) through a power delivery network (PDN) (portions of the PDN external to the IC package 1000 are not shown) associated with the electronic device.

The IC die 1002 is electrically coupled to a multi-layer package substrate 1004 below it in a flip-chip style. For example, one or more soldering balls 1006 may electrically couple the die 1002 to metal traces located within a first metal layer 1022 of the package substrate 1004. According to other aspects, the IC die 1002 may be wire bonded to the package substrate 1004. The package substrate 1004 may be, for example, a four metal layer laminate substrate. In other aspects, the package substrate 1004 may have three or more metal layers, including five, six, seven, eight, nine, or ten metal layers.

The four layer package substrate 1004 shown includes the first metal layer 1022 (e.g., first outer metal layer), a second metal layer 1024 (e.g., first inner metal layer), a third metal layer 1026 (e.g., second inner metal layer), and a fourth metal layer 1028 (e.g., second outer metal layer. Each of the metal layers 1022, 1024, 1026, 1028 are generally separated from one another by a plurality of insulating layers 1032, 1034, 1036 that may be composed of one or more dielectric materials, such as, but not limited to, epoxy and/or resin. In particular, the first insulating layer 1034 in the middle of the package substrate 1004 may be thicker than the other layers and also provides structural rigidity to the package substrate 1004. A plurality of metal vertical interconnect accesses (vias) 1008 electrically couple traces of the plurality of metal layers 1022, 1024, 1026, 1028 of the package substrate 1004 to each other where desired.

The package substrate 1004 includes a cavity 1035 (indicated by the dashed line box) that houses an embedded passive substrate (EPS) discrete circuit component (DCC) 1010, such as a capacitor, resistor, or inductor. In some implementations, the EPS discrete circuit component is the coupled inductor structure described herein (e.g., coupled inductor structure of FIGS. 2-3). It should be noted that the DCC 1010 is a conceptual representation of a DCC and does not necessarily represent exactly how the DCC (e.g., coupled inductor structure) is formed and coupled in the substrate. Rather, the DCC 1010 in FIGS. 10 and 11 is merely intended to show a possible location of a DCC in a substrate. Different implementations may use different configurations and designs to couple the electrodes of the DCC to the vias in the substrate. For example, a first electrode (which is coupled to a first conductive layer) for the DCC may be coupled to the top left vias while a second electrode (which is coupled to a second conductive layer) for the DCC may be coupled to the top right vias in some implementations.

The cavity 1035 may occupy or be located within a portion of the first insulator layer 1034, and also one or more of the inner metal layers 1024, 1026. In the illustrated example, the DCC 1010 may be, for example, a discrete capacitor (e.g., "decoupling capacitor"). According to one aspect, the discrete capacitor 1010 helps reduce the impedance at a range of frequencies of the PDN by balancing inductive components of the impedance due to the IC package 1000 (e.g., inductance caused by traces, vias, metal lines, etc. associated with the package substrate 1004). The package substrate 1004 may have a plurality of cavities each housing a separate EPS discrete circuit component.

Among other things, the package substrate 1004 may comprise one or more via coupling components (e.g., via coupling component 1040) that are electrically coupled to electrodes of the DCC 1010. The via coupling components serve as a means for increasing the available surface area to which a plurality of vias may couple to (e.g., a first end of each via may couple to the via coupling components). The via coupling components are composed of a conductive material, such as a metal or metal alloy (e.g., copper, aluminum, and/or titanium nitride, etc.). According to one aspect, the via coupling components are made of one or more of the same metals that comprise the inner metal layers 1024, 1026.

According to one aspect, a first via coupling component is electrically coupled to both a first electrode of the DCC 1010 and a first metal trace within the first inner metal layer 1024; a second via coupling component is electrically coupled to both the first electrode and a second metal trace within the second inner metal layer 1026; a third via coupling component is electrically coupled to both a second electrode of the DCC 1010 and a third metal trace within the first inner metal layer 1024; a fourth via coupling component is electrically coupled to both the second electrode and a fourth metal trace within the second inner metal layer 1026.

Each of the aforementioned metal traces may be electrically coupled to a power or ground plane associated with the package substrate 1004. For example, the first metal trace may be electrically coupled to the second metal trace by means of a via, and the third metal trace may be electrically coupled to the fourth metal trace by means of another via. In this fashion, the via coupling components may be electrically coupled to power or ground planes within the first and second inner metal layers 1024, 1026, wherein the first and second inner metal layers are closer to the first insulator layer 1034 than the outer metal layers 1022, 1028.

According to one aspect, a first portion of the first via coupling component extends beyond a first edge of the first electrode of the DCC 1010. According to another aspect, a second portion of the first via coupling component is positioned within the first inner metal layer 1024. Similarly, a first portion of the second via coupling component may extend beyond a second edge of the first electrode, and a second portion of the second via coupling component may be positioned within the second inner metal layer 1026. According to one aspect, a first portion of the third via coupling component extends beyond a first edge of the second electrode of the DCC 1010. According to another aspect, a second portion of the third via coupling component is positioned within the first inner metal layer 1024. Similarly, a first portion of the fourth via coupling component may extend beyond a second edge of the second electrode, and a second portion of the fourth via coupling component may be positioned within the second inner metal layer 1026.

Figure 11:
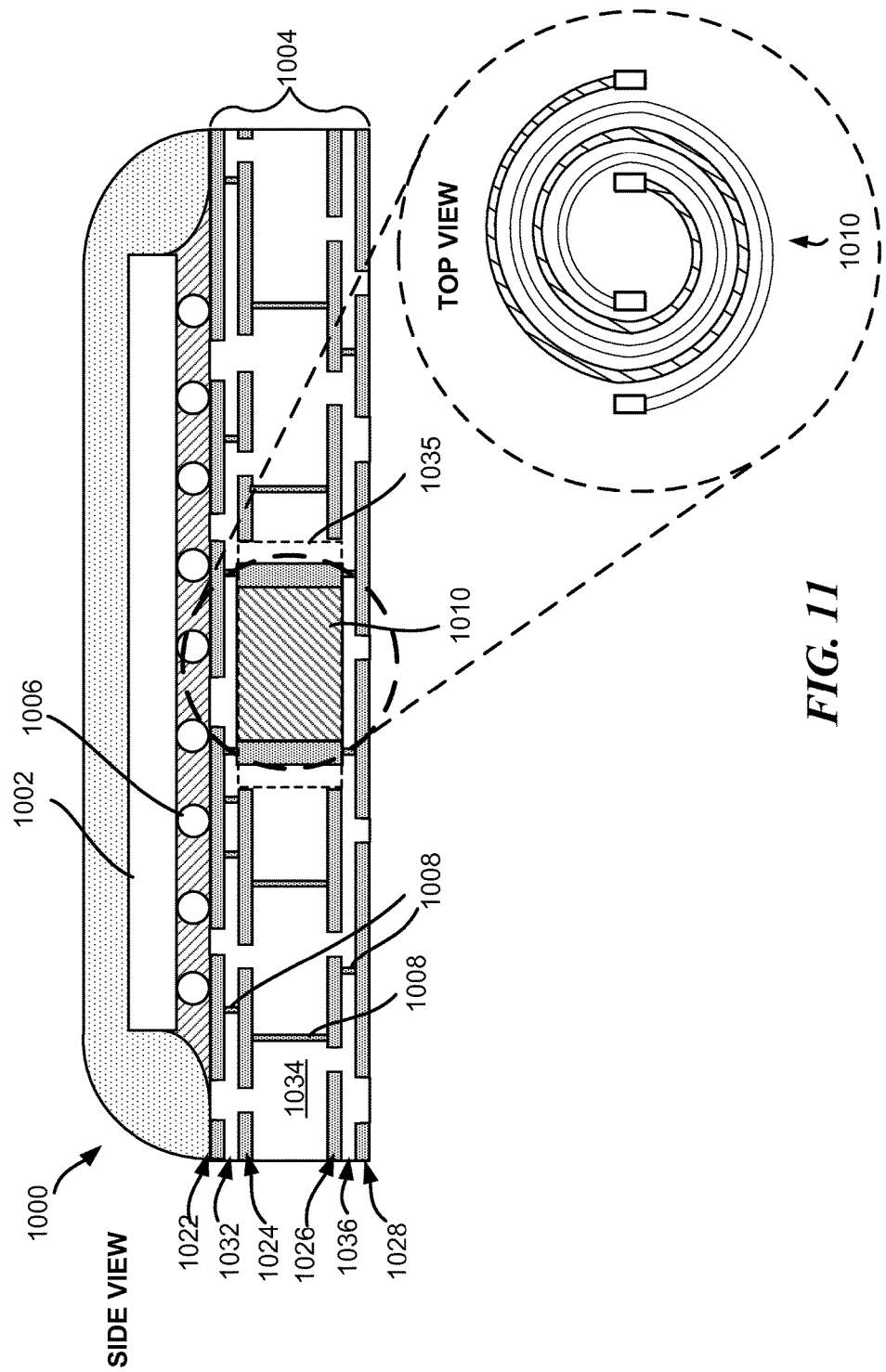
FIG. 11 illustrates another substrate-less coupled inductor structure integrated in a package substrate.

FIG. 11 illustrates a capacitor structure in another substrate in some implementations. FIG. 11 is similar to FIG. 10. However, one difference between FIGS. 10 and 11 is that in FIG. 11, the substrate 1004 does not include one or more via coupling components (e.g., via coupling component 1040 of FIG. 10).

Having described various examples of coupled inductor structures, a method for operating a coupled inductor structure will now be described below.

Exemplary Electronic Devices

Figure 12:
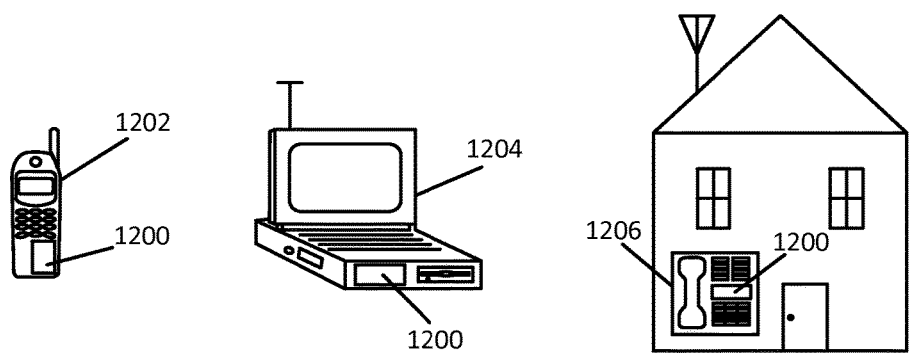
FIG. 12 illustrates various electronic devices that may be integrated with any of the aforementioned integrated circuit, die, die package and/or substrate.

FIG. 12 illustrates various electronic devices that may be integrated with any of the aforementioned integrated circuit, die or package. For example, a mobile telephone 1202, a laptop computer 1204, and a fixed location terminal 1206 may include an integrated circuit (IC) 1200 as described herein. The IC 1200 may be, for example, any of the integrated circuits, dice or packages described herein. The devices 1202, 1204, 1206 illustrated in FIG. 12 are merely exemplary. Other electronic devices may also feature the IC 1200 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4A-4C, 5, 6, 7, 8, 9, 10, 11 and/or 12 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "die package" is used to refer to an integrated circuit wafer that has been encapsulated or packaged or encapsulated.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An inductor structure, comprising:
a first inductor winding that includes an electrically conductive material;
a second inductor winding that includes an electrically conductive material; and
an epoxy filler laterally located between the first inductor winding and the second inductor winding, the epoxy filler configured to provide structural coupling of the first and second inductor windings, wherein the first inductor winding, the second inductor winding and the epoxy filler are substrate-less, and not in direct contact with any substrate base portion,
wherein the inductor structure comprises a thickness of 200 microns or less.

2. The inductor structure of claim 1, wherein the first inductor winding is laterally co-planar to the second inductor winding, wherein the thickness of the inductor structure is in a range of 90 microns to 200 microns.

3. The inductor structure of claim 1, wherein the first inductor winding has a first spiral shape and the second inductor winding has a second spiral shape.

4. The inductor structure of claim 1, wherein the first inductor winding and the second inductor winding have an elongated circular shape.

5. The inductor structure of claim 1, wherein the first inductor winding includes a first terminal and a second terminal, and the second inductor winding includes a third terminal and a fourth terminal.

6. The inductor structure of claim 5, wherein the first terminal is coupled to a first end of the first inductor winding and the second terminal is coupled a second end of the first inductor winding.

7. The inductor structure of claim 1, wherein a thickness of the first inductor winding is in a range of 90 microns to 200 microns.

8. The inductor structure of claim 1, wherein the inductor structure is integrated on a package-on-package (PoP) structure.

9. The inductor structure of claim 1, wherein the inductor structure is integrated on a surface of a package substrate comprising at least one dielectric layer.

10. The inductor structure of claim 1, wherein the inductor structure is integrated inside a package substrate comprising at least one dielectric layer.

11. The inductor structure of claim 1, wherein the inductor structure is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

12. The inductor structure of claim 1, wherein the inductor structure is formed such that portions of the first inductor winding, the second inductor winding and the filler are free of the substrate base portion.

13. The inductor structure of claim 1, wherein the inductor structure is formed such that an area directly next to the first inductor winding, the second inductor winding and the filler, is free of the substrate base portion.

14. An apparatus comprising:
a first inductive means;
a second inductive means; and
an epoxy filler laterally located between the first inductive means and the second inductive means, the epoxy filler configured to provide structural coupling of the first and second inductive means, wherein the first inductive means, the second inductive means and the epoxy filler are substrate-less, and not in direct contact with any substrate base portion, wherein the apparatus comprises a thickness of 200 microns or less.

15. The apparatus of claim 14, wherein the first inductive means is laterally co-planar to the second inductive means, wherein the thickness of the apparatus is in a range of 90 microns to 200 microns.

16. The apparatus of claim 14, wherein the first inductive means has a first spiral shape and the second inductive means has a second spiral shape.

17. The apparatus of claim 14, wherein the first inductive means and the second inductive means have an elongated circular shape.

18. The apparatus of claim 14, wherein the first inductive means includes a first terminal and a second terminal, and the second inductive means includes a third terminal and a fourth terminal.

19. The apparatus of claim 18, wherein the first terminal is coupled to a first end of the first inductive means and the second terminal is coupled a second end of the first inductive means.

20. The apparatus of claim 14, wherein a thickness of the first inductive means is in a range of 90 microns to 200 microns.

21. The apparatus of claim 14, wherein the apparatus is integrated on a package-on-package (PoP) structure.

22. The apparatus of claim 14, wherein the apparatus is integrated on a surface of a package substrate comprising at least one dielectric layer.

23. The apparatus of claim 14, wherein the apparatus is integrated inside a package substrate comprising at least one dielectric layer.

24. The apparatus of claim 14, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

25. The apparatus of claim 14, wherein the inductor structure is formed such that an area directly next to the first inductive means, the second inductive means and the filler, is free of the substrate base portion.

26. A method for providing an inductor structure, comprising:

providing a substrate;

providing a first inductor winding and a second inductor winding on the substrate;

providing an epoxy filler between the first inductor winding and the second inductor winding, the epoxy filler configured to provide structural coupling of the first and second inductor windings; and subsequent to providing the epoxy filler, removing the substrate such that the first inductor winding, the second inductor winding and the epoxy filler are substrate-less and not in direct contact with any substrate base portion, wherein the inductor structure comprises a thickness of 200 microns or less.

27. The method of claim 26, wherein providing the first inductor winding and the second inductor winding on the substrate comprises:

providing a sacrificial layer above the substrate;

selectively removing portions of the sacrificial layer;

providing a metal layer above the substrate and the sacrificial layer, the metal layer forming the first inductor winding and the second inductor winding; and removing the sacrificial layer.

28. The method of claim 26, wherein providing the first inductor winding and the second inductor winding comprises providing the first inductor winding to be laterally co-planar to the second inductor winding, wherein the thickness of the inductor structure is in a range of 90 microns to 200 microns.

29. The method of claim 26, wherein the first inductor winding has a first spiral shape and the second inductor winding has a second spiral shape.

30. The method of claim 26, wherein the first inductor winding and the second inductor winding have an elongated circular shape.

31. The method of claim 26, wherein the first inductor winding includes a first terminal and a second terminal, and the second inductor winding includes a third terminal and a fourth terminal.

32. The method of claim 31, wherein the first terminal is coupled to a first end of the first inductor winding and the second terminal is coupled a second end of the first inductor winding.

33. The method of claim 26, further comprising providing the inductor structure on a package-on-package (PoP) structure.

34. The method of claim 26, further comprising providing the inductor structure on a surface of a package substrate comprising at least one dielectric layer.

35. The method of claim 26, further comprising providing the inductor structure inside a package substrate comprising at least one dielectric layer.

36. The method of claim 26, further comprising providing the inductor structure into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *